(12) United States Patent
Pasala et al.

(10) Patent No.: US 12,148,495 B2
(45) Date of Patent: *Nov. 19, 2024

(54) DETECT WHETHER DIE OR CHANNEL IS DEFECTIVE TO CONFIRM TEMPERATURE DATA

(71) Applicant: Micron Technology, Inc., Boise, ID (US)

(72) Inventors: Venkata Naga Lakshman Pasala, Milpitas, CA (US); Wei Wang, Dublin, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 25 days.

This patent is subject to a terminal disclaimer.

(21) Appl. No.: 18/117,599

(22) Filed: Mar. 6, 2023

(65) Prior Publication Data

US 2023/0207042 A1 Jun. 29, 2023

Related U.S. Application Data

(63) Continuation of application No. 17/397,213, filed on Aug. 9, 2021, now Pat. No. 11,621,049.

(60) Provisional application No. 63/198,127, filed on Sep. 30, 2020.

(51) Int. Cl.
| | |
|---|---|
| *G11C 29/42* | (2006.01) |
| *G11C 7/02* | (2006.01) |
| *G11C 29/40* | (2006.01) |
| *G11C 29/44* | (2006.01) |
| *G11C 29/12* | (2006.01) |

(52) U.S. Cl.
CPC ............. *G11C 29/42* (2013.01); *G11C 7/02* (2013.01); *G11C 29/40* (2013.01); *G11C 29/4401* (2013.01); *G11C 2029/1208* (2013.01); *G11C 2029/4002* (2013.01)

(58) Field of Classification Search
CPC .......... G11C 29/42; G11C 7/02; G11C 29/40; G11C 29/4401; G11C 2029/1208; G11C 2029/4002
See application file for complete search history.

(56) References Cited

U.S. PATENT DOCUMENTS

| 8,181,100 B1* | 5/2012 | Purdham | ............... G11C 29/02 |
| | | | 714/819 |
| 11,621,049 B2* | 4/2023 | Pasala | ..................... G11C 7/04 |
| | | | 365/185.09 |
| 2014/0101371 A1* | 4/2014 | Nguyen | ............ G11C 16/3495 |
| | | | 711/103 |

(Continued)

*Primary Examiner* — Tuan T Nguyen
(74) *Attorney, Agent, or Firm* — Lowenstein Sandler LLP (57) ABSTRACT

A system includes a plurality of memory dice and a processing device coupled to the plurality of memory dice. The processing device is to determine whether an error correcting code (ECC) check of ECC-protected data read from a die of the plurality of memory dice results in detecting an error. In response to detecting the error from the ECC-protected data, the processing device performs a confirmation check that the error is a result of a defect in the die. In response to the confirmation check confirming the die is defective, the processing device ignores a temperature value from the die when determining whether to trigger a thermal-related operation.

20 Claims, 6 Drawing Sheets

(56) References Cited

U.S. PATENT DOCUMENTS

| | | | |
|---|---|---|---|
| 2015/0255175 A1* | 9/2015 | Hyder | G11C 29/4401 |
| | | | 714/719 |
| 2016/0155515 A1* | 6/2016 | Son | G11C 11/1673 |
| | | | 714/719 |
| 2019/0267054 A1* | 8/2019 | Thalaimalaivanaraj | ...................... |
| | | | G11C 16/26 |
| 2020/0341840 A1 | 10/2020 | Chang | |
| 2021/0012852 A1 | 1/2021 | Tanaka | |
| 2022/0068424 A1 | 3/2022 | Lee | |
| 2022/0350500 A1 | 11/2022 | Chen | |
| 2022/0366998 A1 | 11/2022 | Rehmeyer | |

\* cited by examiner

DETECT WHETHER DIE OR CHANNEL IS DEFECTIVE TO CONFIRM TEMPERATURE DATA

REFERENCE TO RELATED APPLICATION

The present application is a continuation of U.S. patent application Ser. No. 17/397,213, filed Aug. 9, 2021, which claims the benefit of U.S. Provisional Patent Application No. 63/198,127, filed Sep. 30, 2020, the entirety of which is incorporated herein by reference.

TECHNICAL FIELD

Embodiments of the disclosure are generally related to memory sub-systems, and more specifically, relate to detect whether die or channel is defective to confirm temperature data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Embodiments of the present disclosure are directed to detect whether die or channel is defective to confirm temperature data. A memory sub-system can be a storage device, a memory module, or a hybrid of a storage device and memory module, any of which can be referred to generally as a memory device. In some examples, a memory device has multiple channels, each coupled to one or more memory dice. Each die, of these multiple memory dice, is a packaged semiconductor chip capable of storing and retrieving data from pages of memory.

During a running state of the memory device, die temperature from all of the memory dice are periodically read out of registers at the multiple memory dice. These temperature values can be stored in the registers from temperature sensors (e.g., thermocouples) coupled to each die. A memory sub-system controller can retrieve these temperature values and trigger thermal-related operations based on one or more of the temperature values. In certain devices, this temperature data read out of registers at the multiple memory dice does not have error protection, such as can be provided using error-correcting code (ECC) values. Accordingly, the temperature values read out of the registers at the multiple memory dice can potentially be wrong, which can incorrectly trigger a thermal-related operation, e.g., throttling an amount of data written to and read from any given die, up to and including shutting down the memory device. Such incorrect triggering of thermal-related events can negatively impact performance of one or more of the memory dice.

Aspects of the present disclosure address the above and other deficiencies by having a memory sub-system that includes a memory sub-system controller (e.g., processing device), which can detect a defective die and/or channel from which a temperature value is retrieved from the die. This can be performed, for example, by reading error correcting-code (ECC)-protected data (such as user data) from the die and performing an ECC error check of the ECC-protected data. If this first ECC check results in not detecting an error, then the temperature value can be considered reliable and be used in triggering one or more thermal-related operations. If the first ECC check results in detecting an error, the controller detects at least a preliminary indication that the temperature value is not reliable.

In various embodiments, the controller can make a further (or confirmation) check to confirm that the die and/or channel are indeed defective, e.g., and thus rule out that the first ECC check failed due to a data retention issue. For example, particularly old data can become corrupt and exhibit errors that are unrelated to failure of a die or channel. In one embodiment, the confirmation check can be performed by storing at least some of the ECC-protected data in the die suspected of being defective. The controller can then read this ECC-protected data back out of the die and perform a further (e.g., second) ECC error check on this newly read ECC-protected data. If the second ECC check results in no error, then the temperature value for the die is reliable and can be used in triggering one or more thermal-related operations. Otherwise, if the second ECC check results in an error, the die and channel from which the temperature value was read can be considered defective and thus unreliable. If unreliable, the temperature value from the die can be ignored in any subsequent determination of whether to trigger a thermal-related operation.

Therefore, advantages of the systems and methods implemented in accordance with some embodiments of the present disclosure include, but are not limited to, detection of a defective die or channel from which a temperature value is obtained and the avoidance of triggering a thermal-related operation (or other thermal event) based on an incorrect temperature value. To avoid a thermal-related operation can include, for example, avoiding performance throttling, avoiding at least partial media management suspension, and possibly avoiding memory device shut down. Other advantages will be apparent to those skilled in the art of managing thermal-related operations within a memory sub-system discussed hereinafter.

Figure 1A:
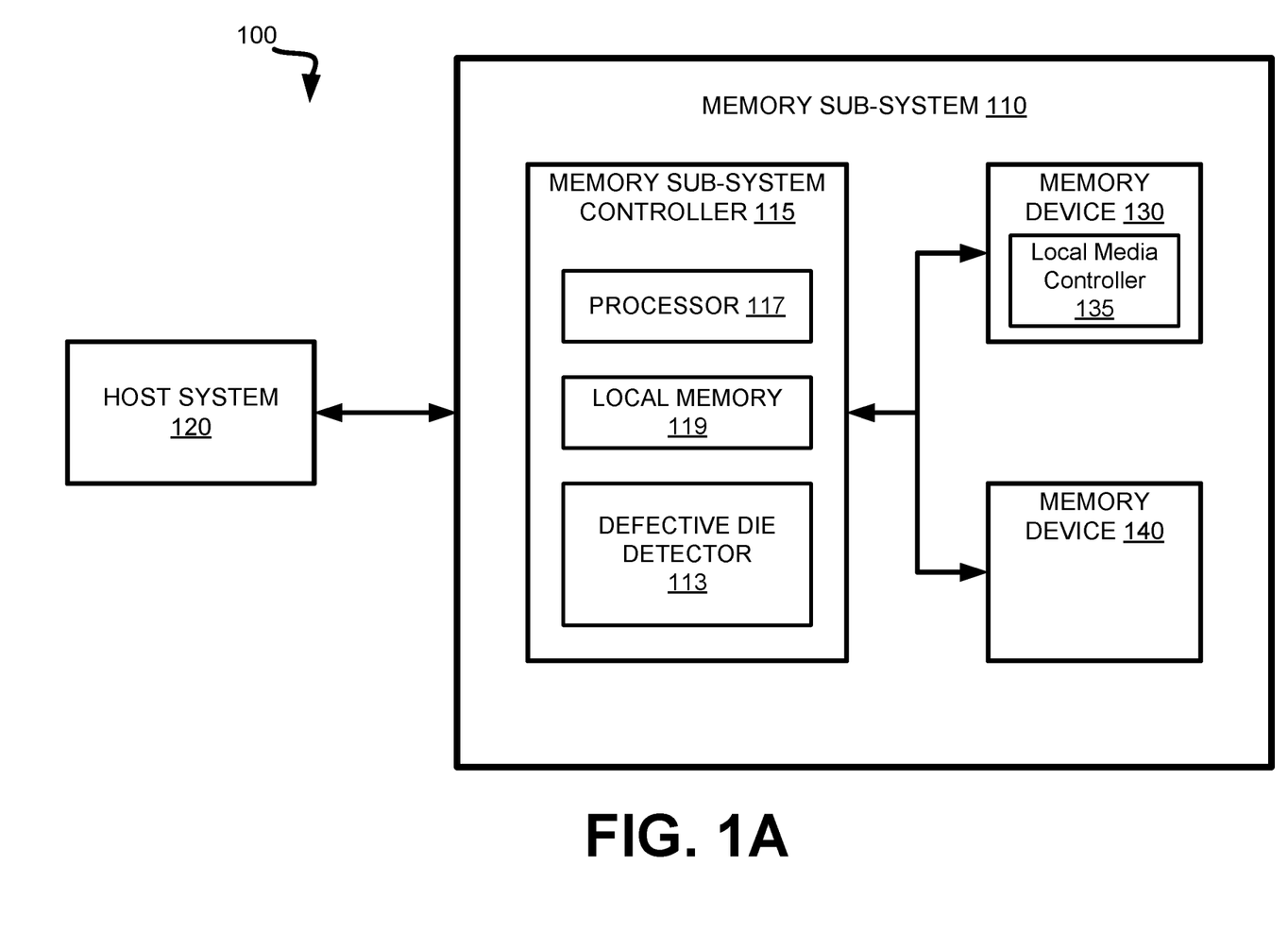
FIG. 1A illustrates an example computing system that includes a memory sub-system in accordance with some embodiments.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. A non-volatile memory device is a package of one or more dice. Each die can include one or more planes. Planes can be groups into logic units (LUN). For some types of non-volatile memory devices (e.g., NAND devices), each plane include a set of physical blocks. A "block" herein refers to a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations, e.g., initiated by a host system 120. For example, the host system 120 can initiate a data operation (e.g., write, read, erase, etc.) on a memory sub-system. The host system 120 can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system 120 associates with the host data. In some examples, host data includes user data stored for a user or application of the memory device.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

In at least some embodiments, the memory sub-system 110 includes a defective die detector 113 that can detect a defective die and/or channel for purposes of confirming temperature data read out of the die and channel. In some embodiments, the memory sub-system controller 115 includes at least a portion of the defective die detector 113. In some embodiments, the defective die detector 113 is part of the host system 110, an application, or an operating system. In other embodiments, the local media controller 135 includes at least a portion of defective die detector 113 and is configured to perform the functionality described herein.

Figure 1B:
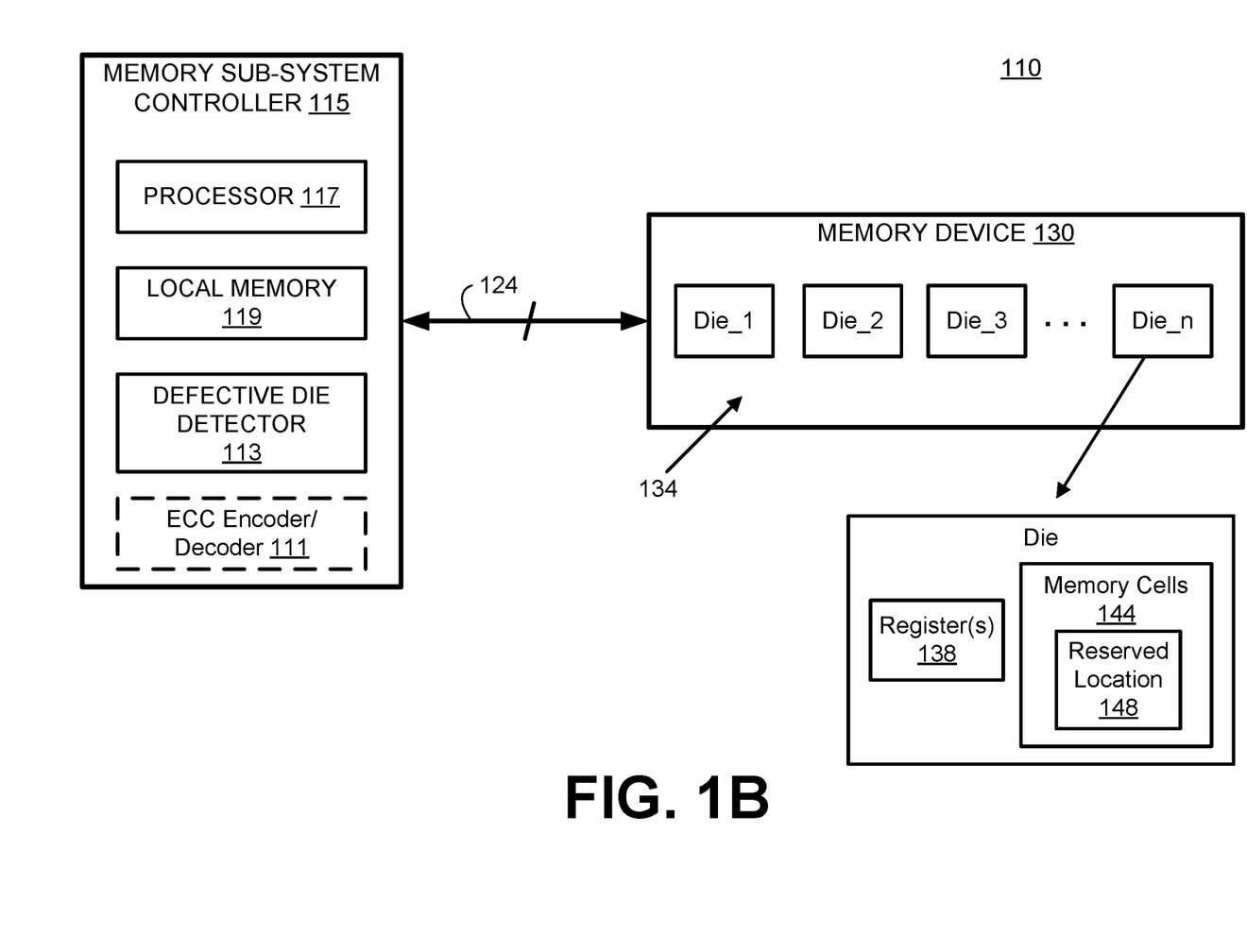
FIG. 1B illustrates the example memory sub-system of FIG. 1A in which the memory device includes multiple memory dice and multiple channels, in accordance with some embodiments.

FIG. 1B illustrates the example memory sub-system 110 of FIG. 1A in which the memory device 130 includes multiple memory dice 134 and multiple channels 124, in accordance with some embodiments. In these embodiments, the multiple channels 124 couple the memory sub-system controller 115 to the multiple memory dice 134 of the memory device 130. For example, each channel of the multiple channels 124 can couple the controller 115 to one or more memory dice of the multiple memory dice 134 over which to carry out read and write operations.

In various embodiments, each die can include one or more register 138 and memory cells 144 to store user data and the like. The register 138 can be used to store a temperature value, e.g., read out from a temperature sensor or thermocouple that is coupled to the die. Within the memory cells 144, the controller 115 can identify a reserved location 148 at which to store some ECC-protected data for performing one of the ECC checks disclosed herein.

More specifically, the defective die detector 113 can perform one or more checks, such as ECC checks, of ECC-protected data read from the multiple memory dice 134 and corresponding channels of the memory sub-system to determine whether a temperature value read out of the register 138 of each die and channel is reliable for use in triggering a thermal-related operation. In some embodiments, an ECC component (e.g., an ECC encoder/decoder 111) of the controller 115 already performs these ECC checks and thus, the defective die detector 113 can interact with the ECC component to trigger performance of the ECC checks on particular data retrieved from the die. In other embodiments, the ECC component is built into the defective die detector 113.

If a first ECC check of the ECC-protected data results in an error for a die and channel, the defective die detector 113 can perform a second ECC check of at least some of the ECC-protected data that is written to the reserved location 148 of the die. If the defective die detector 113 detects the error or a second error as a result of the second ECC check, a defect in the die and/or channel is confirmed and the temperature value read out of the register 138 of that die is unreliable for use in triggering thermal-related operations. Further details with regards to the operations of the defective die detector 113 are described below.

Figure 2A:
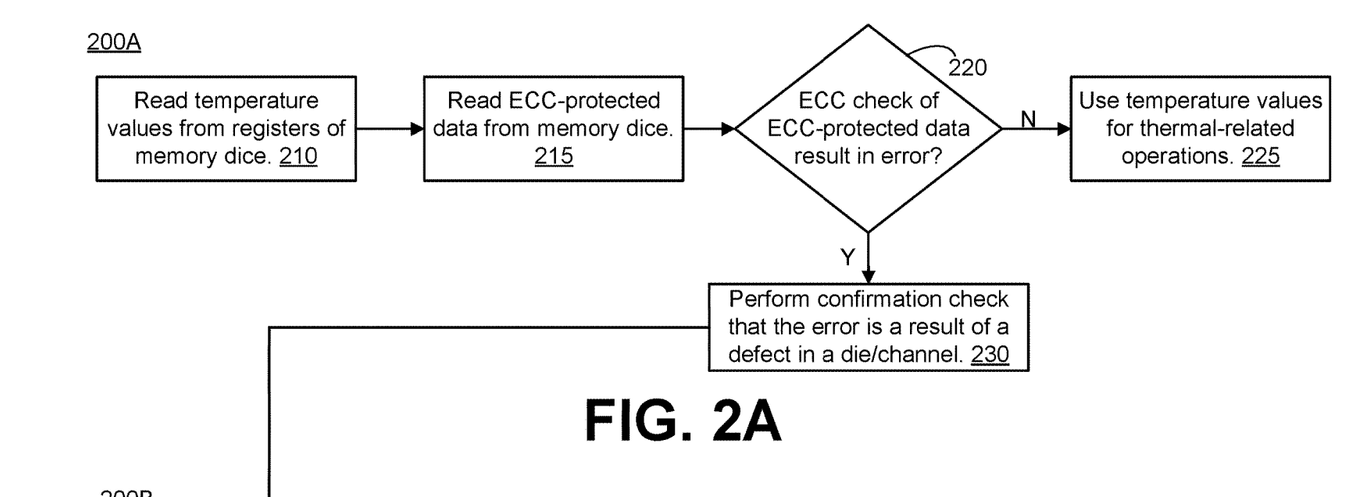
FIG. 2A is a flow diagram of an example method of detecting defective die or channel using error-correcting code (ECC) checks to confirm temperature data, in accordance with some embodiments.

FIG. 2A is a flow diagram of an example method 200A of detecting defective die or channel using error-correcting code (ECC) checks to confirm temperature data, in accordance with some embodiments. The method 200A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200A is performed by the defective die detector 113 of FIG. 1A. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 210, the processing logic causes temperature values to be read from registers at the multiple memory dice 134, where each temperature value is associated with a temperature at a respective die of the multiple memory dice 134. At operation 215, the processing logic causes error-correcting code (ECC)-protected data to be read from the multiple memory dice 134. This ECC-protected data can be user or system data that include ECC values and is cable of undergoing ECC error detection and correction in ECC checks.

At operation 220, the processing logic determines whether an ECC check of the ECC-protected data results in detecting an error. If, at operation 220, there is no error detected in the ECC-protected data, at operation 225, the processing logic uses the temperature values for thermal-related operations. These thermal-related operations, for example, can be performed in relation to a specific die or in relation to all of the multiple memory dice 134 depending on design, e.g., which temperature conditions are being detected, and for which thermal-related operations are being assessed. In some embodiments, the thermal-related operations also include an operation associated with the memory sub-system, e.g., related to media management of the controller 115. In one embodiment, the operations further include, in response to not detecting the error from the ECC-protected data: aggregating the temperature values to determine an aggregate temperature; and performing a thermal-related operation using the aggregate temperature.

If, at operation 220, the processing logic detects an error for the ECC-protected data associated with a die of the multiple memory dice 134, the processing logic, at operation 230, performs a confirmation check that the error is a result of a defect in a die (and/or an identified channel coupled between the die and the controller 115). For example, in some situations, the ECC-protected data read from a particular die can experience retention issues due to age or for reasons of data corruption unrelated to a defective die and channel. For this reason, the processing logic can proceed to the features of FIG. 2B to perform the such a confirmation check.

Figure 2B:
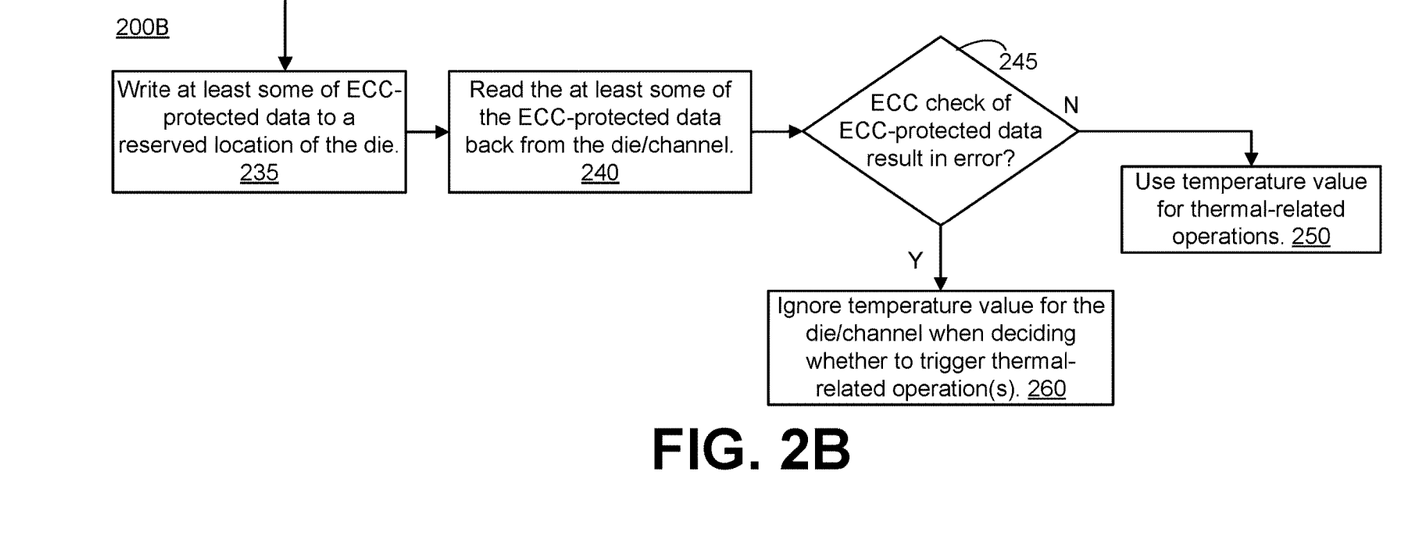
FIG. 2B is a flow diagram of an example method of confirming that the die or channel is defective, in accordance with some embodiments.

FIG. 2B is a flow diagram of an example method 200B of confirming that the die or channel is defective, in accordance with some embodiments. The method 200B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200B is performed by the defective die detector 113 of FIG. 1A. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 235, the processing logic causes at least some of the ECC-protected data to be written to a reserved location of the die, e.g., the reserved location 148 of the memory cells 144 illustrated in FIG. 1B. In one embodiment, this ECC-protected data can be some (or all) of the ECC-protected data read from the die at operation 215. In another embodiment, this ECC-protected data can be other ECC-protected data known to be error-free, for example.

At operation 240, the processing logic causes the at least some of the ECC-protected data to be read back from the die and identified channel. At operation 245, the processing logic determines whether an ECC check of the ECC-protected data read back from the die and channel results in detecting one of the first error or a second error indicative of a defect in the die or in a channel coupled to the die. If, at operation 245, the processing logic does not detect an error, at operation 250, the processing logic uses the temperature value from the die for thermal-related operations. These thermal-related operations, for example, can be performed in relation to the specific die or in relation to all of the multiple memory dice 134 depending on design and which temperature conditions are being detected for use in the thermal-related operations.

If, at operation 245, the processing logic detects an error (whether the first error or an unrelated second error associated with the confirmation), at operation 260, the processing logic ignores the temperature value from the die for purpose of triggering a thermal-related operation due to confirming the die (and/or the identified channel coupled to the die) is defective. Although a thermal-related operation related to die may not be possible in this situation, ignoring the temperature value for the defective die (or channel) enables the processing logic to proceed with other thermal-related operations for other memory dice of the multiple memory dice 134 or for the memory sub-system 110 generally.

Figure 3:
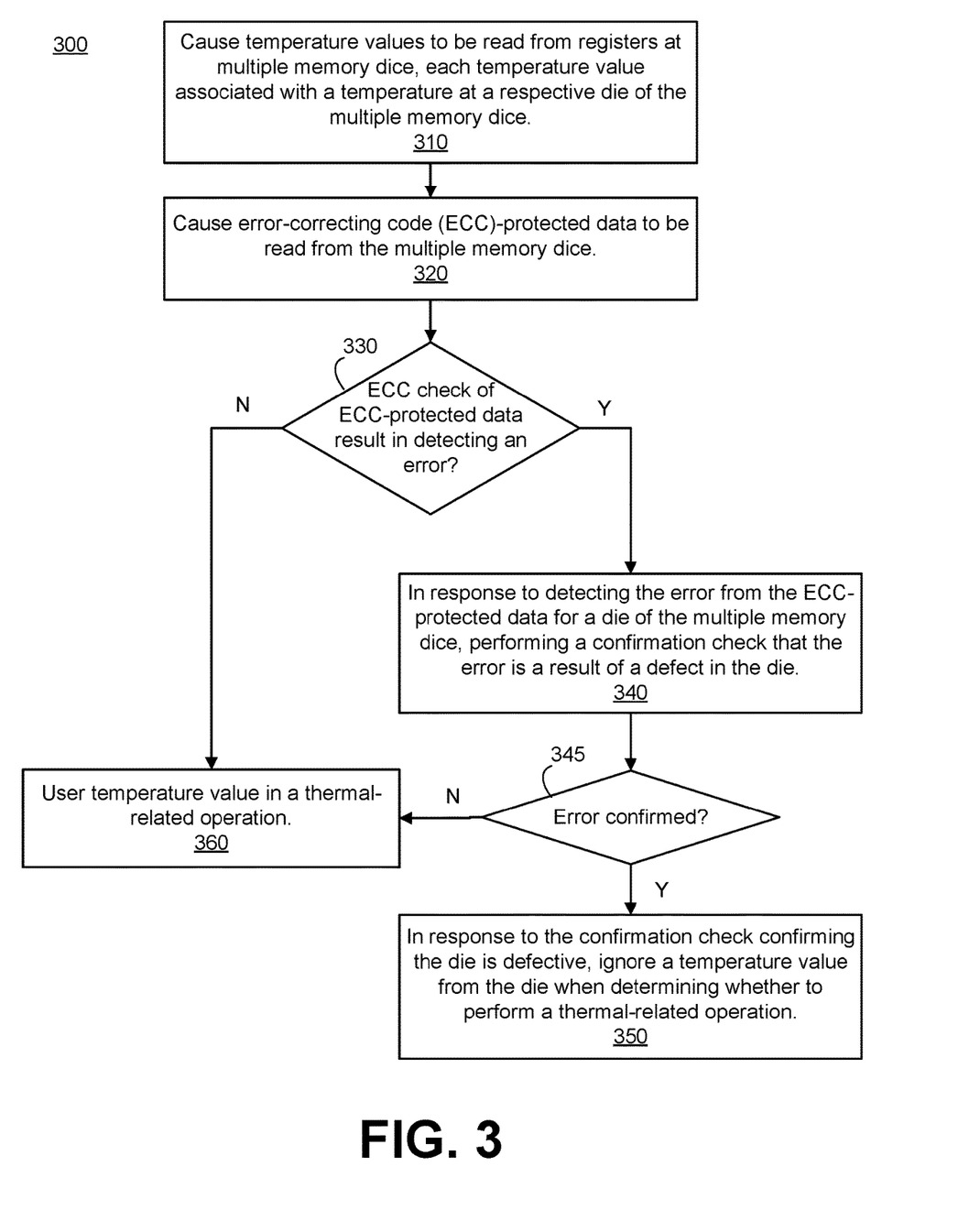
FIG. 3 is a flow diagram of an example method of confirming that the die is defective, in accordance some embodiments.

FIG. 3 is a flow diagram of an example method 300 of confirming that the die is defective, in accordance some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the defective die detector 113 of FIG. 1A. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 310, the processing logic causes temperature values to be read from registers at multiple memory dice, where each temperature value is associated with a temperature at a respective die of the multiple memory dice.

At operation 320, the processing device cause error-correcting code (ECC)-protected data to be read from the multiple memory dice.

At operation 330, the processing device determines whether an ECC check of the ECC-protected data results in detecting an error.

At operation 340, the processing device, in response to detecting the error from the ECC-protected data for a die of the multiple memory dice, performs a confirmation check that the error is a result of a defect in the die.

At operation 345, the processing logic determines whether the error is confirmed, e.g., based on the results of the confirmation check.

At operation 350, the processing device, in response to the confirmation check confirming the die is defective, ignores a temperature value from the die when determining whether to trigger a thermal-related operation. Operations 330 through 350 can also result in detecting that multiple die are defective, and thus determine to ignore multiple temperature values from multiple memory dice in at least some embodiments.

At operation 360, the processing logic, in response to one of not detecting (e.g., no response to operation 330) or not confirming (e.g., no response to operation 345) the error, performs a thermal-related operation using the temperature value read out of the die.

Figure 4:
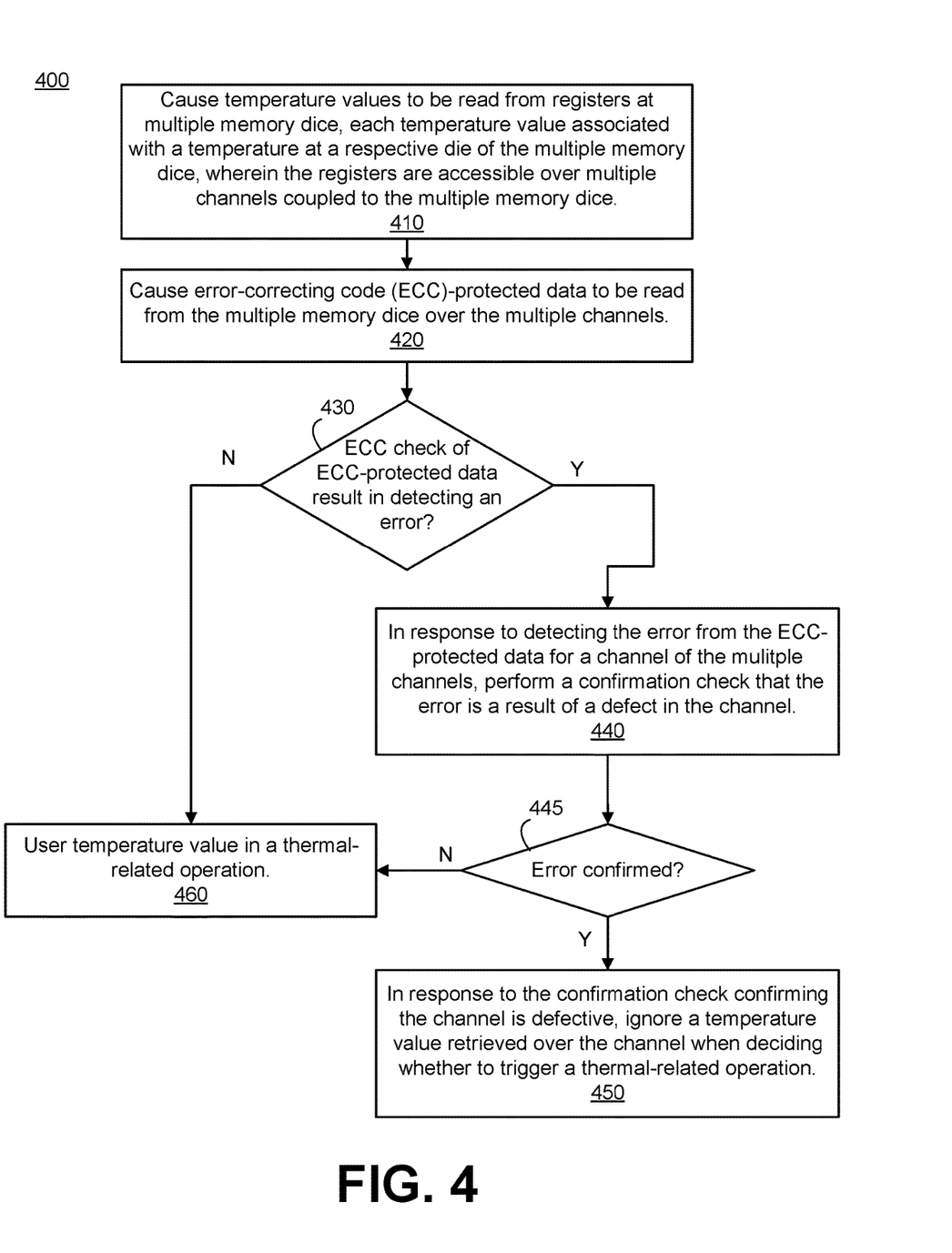
FIG. 4 is a flow diagram of an example method of confirming that the channel is defective, in accordance some embodiments.

FIG. 4 is a flow diagram of an example method 400 of confirming that the channel is defective, in accordance some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the defective die detector 113 of FIG. 1A. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 410, the processing logic causes temperature values to be read from registers at multiple memory dice, where each temperature value is associated with a temperature at a respective die of the multiple memory dice, and the registers are accessible over multiple channels coupled to the multiple memory dice.

At operation 420, the processing logic causes error-correcting code (ECC)-protected data to be read from the multiple memory dice over the multiple channels.

At operation 430, the processing logic determines whether an ECC check of the ECC-protected data results in detecting an error.

At operation 440, the processing logic, in response to detecting the error from the ECC-protected data for a channel of the multiple channels, performs a confirmation check that the error is a result of a defect in the channel.

At operation 445, the processing logic determines whether the error is confirmed, e.g., based on the results of the confirmation check.

At operation 450, the processing logic, in response to the confirmation check confirming the channel is defective, ignores a temperature value retrieved over the channel when deciding whether to trigger a thermal-related operation. Operations 430 through 450 can also result in detecting that multiple channels are defective, and thus determine to ignore multiple temperature values from multiple channels (and coupled memory dice) in at least some embodiments.

At operation 460, the processing logic, in response to one of not detecting (e.g., no response to operation 430) or not confirming (e.g., no response to operation 445) the error, performs a thermal-related operation using the temperature value read over of the channel. In some embodiments, the methods 300 and 400 are combined such that whether a defect is detected in the die or the channel coupled to the die, the result is to ignore the temperature value as operation operations 350 or 450, respectively.

Figure 5:
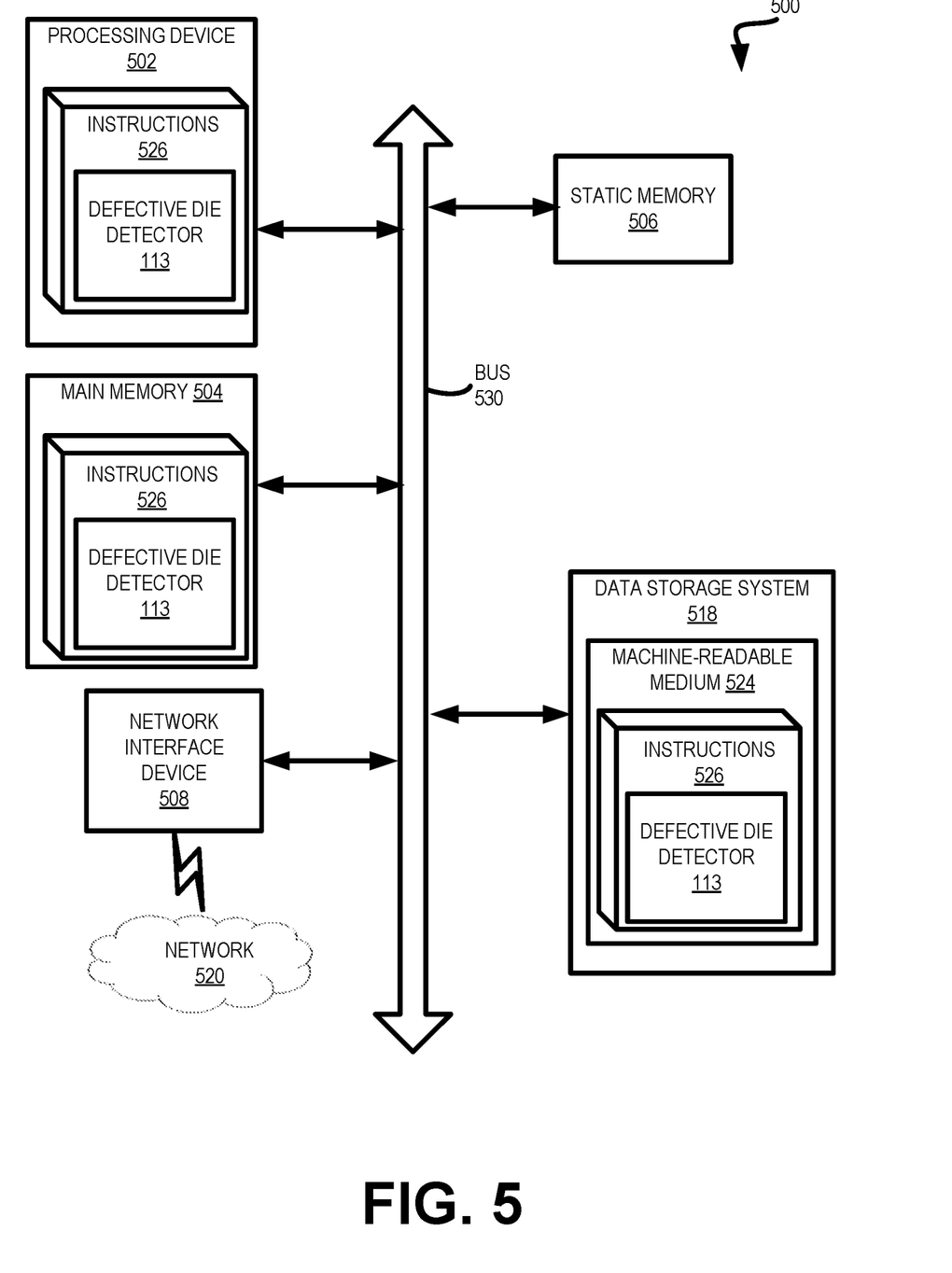
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the defective die detector 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 510 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 528 for performing the operations and steps discussed herein. The computer system 500 can further include a network interface device 512 to communicate over the network 520.

The data storage system 518 can include a machine-readable storage medium 524 (also known as a computer-readable medium) on which is stored one or more sets of instructions 528 or software embodying any one or more of the methodologies or functions described herein. The instructions 528 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1A.

In one embodiment, the instructions 528 include instructions to implement functionality corresponding to the defective die detector 113 of FIG. 1A. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A system comprising:
a plurality of memory dice; and
a processing device coupled to the plurality of memory dice, the processing device to perform operations comprising:
determining whether an error correcting code (ECC) check of ECC-protected data read from a die of the plurality of memory dice results in detecting an error;

in response to detecting the error from the ECC-protected data, performing a confirmation check that the error is a result of a defect in the die; and in response to the confirmation check confirming the die is defective, ignoring a temperature value retrieved from a register of the die when determining whether to trigger a thermal-related operation that is normally based, at least in part, on temperature values retrieved from the plurality of memory dice, wherein the temperature value is unprotected by the ECC check.

2. The system of claim 1, further comprising a plurality of channels coupled between the plurality of memory dice and the processing device, wherein the temperature value and the ECC-protected data are associated with an identified channel of the plurality of channels.

3. The system of claim 2, wherein performing the confirmation check is further to confirm that the error is the result of a defect in one of the die or the identified channel that is coupled to the die.

4. The system of claim 1, wherein, in response to one of not detecting or not confirming the error, the operations further comprise performing the thermal-related operation using the temperature value.

5. The system of claim 1, wherein the operations further comprise, in response to one of not detecting or not confirming the error from the ECC-protected data:

aggregating temperature values associated with respective ones of the plurality of memory dice to determine an aggregate temperature; and performing the thermal-related operation using the aggregate temperature.

6. The system of claim 1, wherein the error is a first error, and wherein the performing the confirmation check comprises:

causing at least some of the ECC-protected data to be written to a reserved location of the die;

causing at least some of the ECC-protected data to be read back from the die; and determining whether an ECC check of the ECC-protected data read back from the die results in detecting one of the first error or a second error, which is indicative of a defect in the die or a channel that is coupled to the die.

7. The system of claim 6, wherein, in response to not detecting the first error or the second error, the operations further comprise:

aggregating temperature values associated with respective ones of the plurality of memory dice to determine an aggregate temperature; and performing the thermal-related operation using the aggregate temperature.

8. A method comprising:

determining, by a processing device coupled to a memory device, whether an error correcting code (ECC) check of ECC-protected data read from a die of a plurality of memory dice results in detecting an error;

in response to detecting the error from the ECC-protected data, performing, by the processing device, a confirmation check that the error is a result of a defect in the die; and in response to the confirmation check confirming the die is defective, ignoring, by the processing device, a temperature value retrieved from a register of the die when determining whether to trigger a thermal-related operation that is normally based, at least in part, on temperature values retrieved from the plurality of memory dice, wherein the temperature value is unprotected by the ECC check.

9. The method of claim 8, wherein the temperature value and the ECC-protected data are associated with an identified channel of a plurality of channels coupled to the plurality of memory dice, and the performing the confirmation check further comprises confirming that the error is the result of a defect in one of the die or the identified channel that is coupled to the die.

10. The method of claim 8, wherein, in response to one of not detecting or not confirming the error, further comprising performing the thermal-related operation using the temperature value.

11. The method of claim 8, further comprising, in response to one of not detecting or not confirming the error from the ECC-protected data:

aggregating temperature values associated with respective ones of the plurality of memory dice to determine an aggregate temperature; and performing the thermal-related operation using the aggregate temperature.

12. The method of claim 8, wherein the error is a first error, and wherein the performing the confirmation check comprises:

causing at least some of the ECC-protected data to be written to a reserved location of the die;

causing at least some of the ECC-protected data to be read back from the die; and determining whether an ECC check of the ECC-protected data read back from the die results in detecting one of the first error or a second error indicative of a defect in the die or a channel that is coupled to the die.

13. The method of claim 12, wherein, in response to not detecting the first error or the second error, further comprising:

aggregating temperature values associated with respective ones of the plurality of memory dice to determine an aggregate temperature; and performing the thermal-related operation using the aggregate temperature.

14. A method comprising:

determining, by a processing device coupled to a memory device, whether an error correcting code (ECC) check of ECC-protected data read over a channel of a plurality of channels results in detecting an error, wherein the plurality of channels are associated with a plurality of memory dice;

in response to detecting the error from the ECC-protected data for a channel of the plurality of channels, performing, by the processing device, a confirmation check that the error is a result of a defect in the channel; and in response to the confirmation check confirming the channel is defective, ignoring, by the processing device, a temperature value retrieved over the channel when determining whether to trigger a thermal-related operation that is normally based, at least in part, on temperature values retrieved from the plurality of memory dice, wherein the temperature value is unprotected by the ECC check.

15. The method of claim 14, wherein, in response to one of not detecting or not confirming the error, further comprising performing the thermal-related operation using the temperature value.

16. The method of claim 14, further comprising, in response to one of not detecting or not confirming the error from the ECC-protected data:

aggregating temperature values associated with respective ones of the plurality of memory dice to determine an aggregate temperature; and performing the thermal-related operation using the aggregate temperature.

17. The method of claim 14, wherein the channel is coupled with a first die of the plurality of memory dice, and wherein the performing the confirmation check comprises confirming that the error is the result of a defect in one of the first die or the channel coupled to the first die.

18. The method of claim 17, wherein, in response to not confirming the error, further comprising performing the thermal-related operation using the temperature value.

19. The method of claim 17, wherein the error is a first error, and wherein the performing the confirmation check comprises:

causing at least some of the ECC-protected data to be written to a reserved location of the first die;

causing at least some of the ECC-protected data to be read back from the first die; and determining whether an ECC check of the ECC-protected data read back from the first die results in detecting one of the first error or a second error indicative of a defect in the first die or the channel coupled to the first die.

20. The method of claim 19, wherein, in response to not detecting the first error or the second error, further comprising:

aggregating temperature values associated with respective ones of the plurality of memory dice to determine an aggregate temperature; and performing the thermal-related operation using the aggregate temperature.

\* \* \* \* \*